(12) United States Patent
Dzisiewski-Smith

(10) Patent No.: US 11,980,177 B2
(45) Date of Patent: May 14, 2024

(54) DIFFERENTIAL PEST SENSOR

(71) Applicant: LAIIER Ltd., London (GB)

(72) Inventor: Stefan Dzisiewski-Smith, London (GB)

(73) Assignee: LAIIER Ltd., London (GB)

( * ) Notice: Subject to any disclaimer, the term of this patent is extended or adjusted under 35 U.S.C. 154(b) by 565 days.

(21) Appl. No.: 17/255,213

(22) PCT Filed: Jun. 28, 2019

(86) PCT No.: PCT/GB2019/051845
§ 371 (c)(1),
(2) Date: Dec. 22, 2020

(87) PCT Pub. No.: WO2020/002945
PCT Pub. Date: Jan. 2, 2020

(65) Prior Publication Data
US 2021/0267185 A1  Sep. 2, 2021

(30) Foreign Application Priority Data

Jun. 28, 2018 (GB) .................................. 1810670
Jul. 25, 2018 (GB) .................................. 1812109
Jul. 31, 2018 (GB) .................................. 1812477

(51) Int. Cl.
*A01M 1/02* (2006.01)
*G01R 19/00* (2006.01)
(Continued)

(52) U.S. Cl.
CPC ......... *A01M 1/026* (2013.01); *G01R 19/0038* (2013.01); *G01R 27/14* (2013.01); *G01R 27/2694* (2013.01)

(58) Field of Classification Search
CPC ... A01M 1/026; G01R 19/0038; G01R 27/14; G01R 27/2694; G08B 21/182
See application file for complete search history.

(56) References Cited

U.S. PATENT DOCUMENTS 4,144,668 A   3/1979  Darncharnjitt
6,581,324 B1  6/2003  Creeger et al.
(Continued)

FOREIGN PATENT DOCUMENTS

GB   2551053    12/2017
JP   H0682563   3/1994
(Continued)

OTHER PUBLICATIONS

PCT International Search Report and Written Opinion for corresponding PCT Application No. PCT/GB2019/051845, dated Sep. 26, 2019, 12 pages.
(Continued)

*Primary Examiner* — John A Tweel, Jr.
(74) *Attorney, Agent, or Firm* — Dority & Manning, PA

(57) ABSTRACT

A pest sensor and a detector for use in a pest sensing system are described. The pest sensor comprises a processor configured to: receive a first signal indicative of a first impedance across a first sensing circuit; receive a second signal indicative of a second impedance across a second sensing circuit; and in response to detecting that one of the first or second signals differs from the other by more than a predefined difference threshold, output an indication of pest activity.

22 Claims, 12 Drawing Sheets

(51) Int. Cl.
 *G01R 27/14* (2006.01)
 *G01R 27/26* (2006.01)

(56) References Cited

U.S. PATENT DOCUMENTS

| | | | |
|---|---|---|---|
| 6,937,156 B2* | 8/2005 | Gardner, Jr. | A01M 31/002 340/573.2 |
| 7,317,399 B2* | 1/2008 | Chyun | A01M 1/026 43/132.1 |
| 10,045,520 B2* | 8/2018 | Carver | G08B 21/18 |
| 10,932,459 B2* | 3/2021 | Kaye | A01M 23/00 |
| 11,523,599 B2* | 12/2022 | Moore | A01M 1/026 |
| 2003/0184442 A1 | 10/2003 | Gardner et al. | |
| 2014/0111019 A1 | 4/2014 | Roy et al. | |
| 2017/0142953 A1 | 5/2017 | Carver et al. | |

FOREIGN PATENT DOCUMENTS

| | | |
|---|---|---|
| WO | WO 2016/073429 | 5/2016 |
| WO | WO 2018/068092 | 4/2018 |

OTHER PUBLICATIONS

International Preliminary Report on Patentability for corresponding PCT Application No. PCT/GB2019/051845, dated Jan. 7, 2021, 10 pages.
Wang, "FDC1004: Basics of Capacitive Sensing and Applications," Texas Instruments, Dec. 2014—Revised Jun. 2021—12 pages.

* cited by examiner

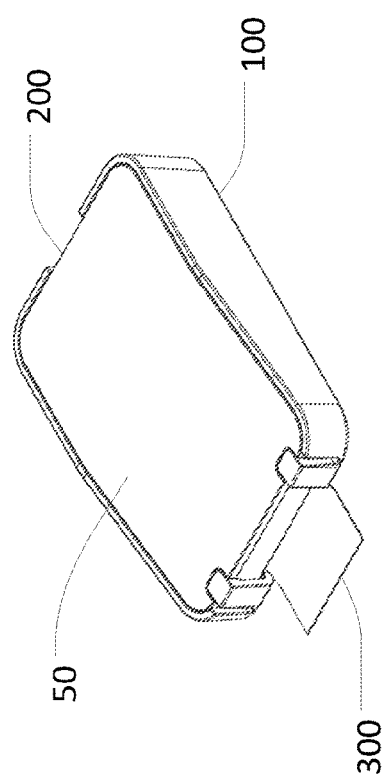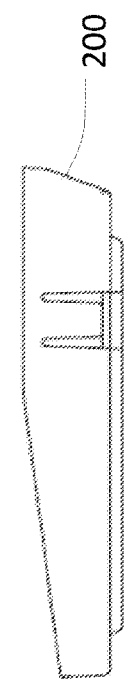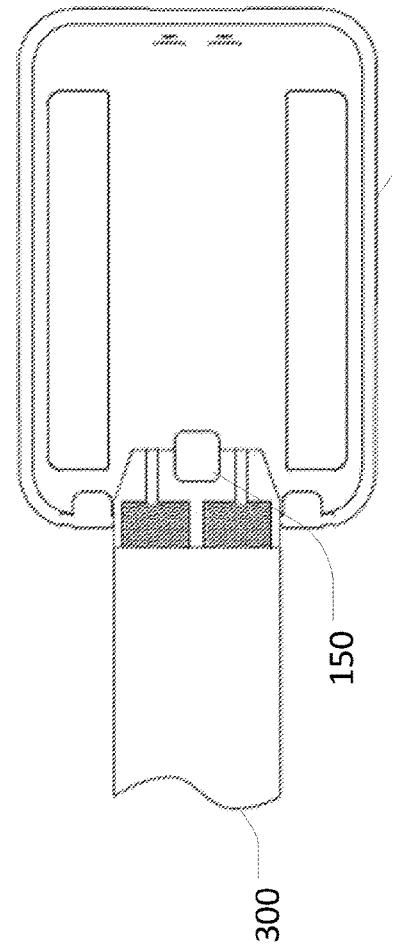

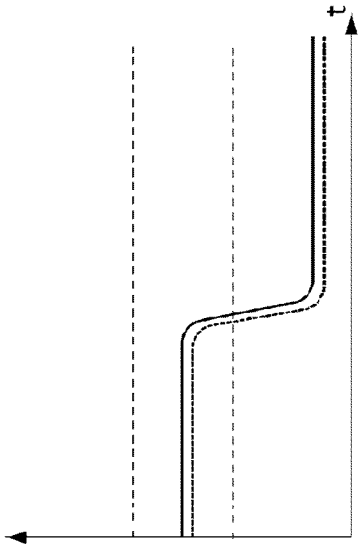

The plots below show two traces each, one from each half of a differential impedance sensor.

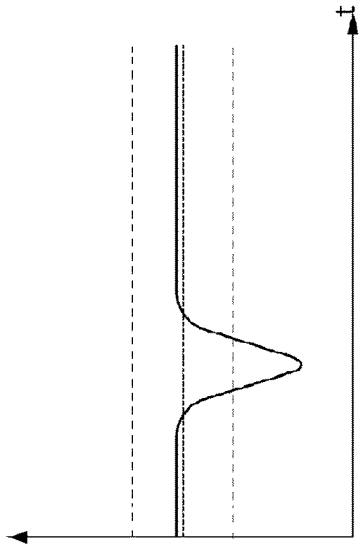

Water (or other conductive material) damage affects both traces similarly, but in an opposite polarity to tearing, and differently to conductive spotting.

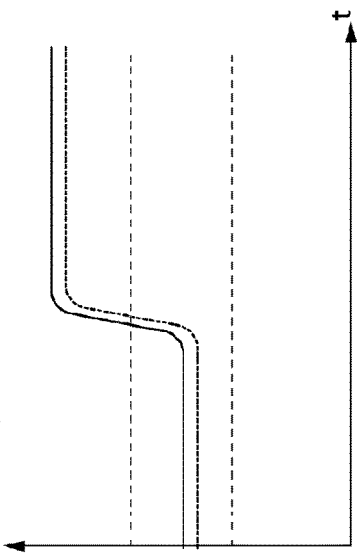

Tearing or disconnection causes both traces to deflect permanently, differentiating it from conductive spotting.

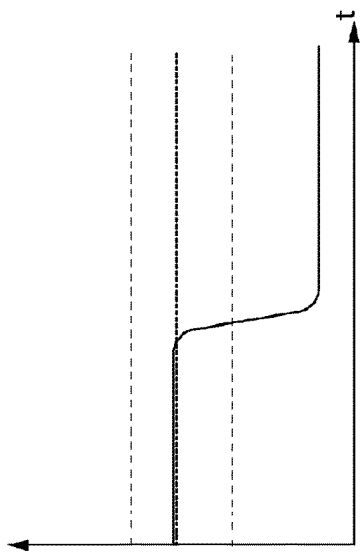

A conductive spot causes a temporary spike on one trace that does not appear on the other. Over time it dries, and the system sees no significant permanent change in levels.

A conductive spot causes a permanent deflection on one trace but nothing on the other.

Fig. 7

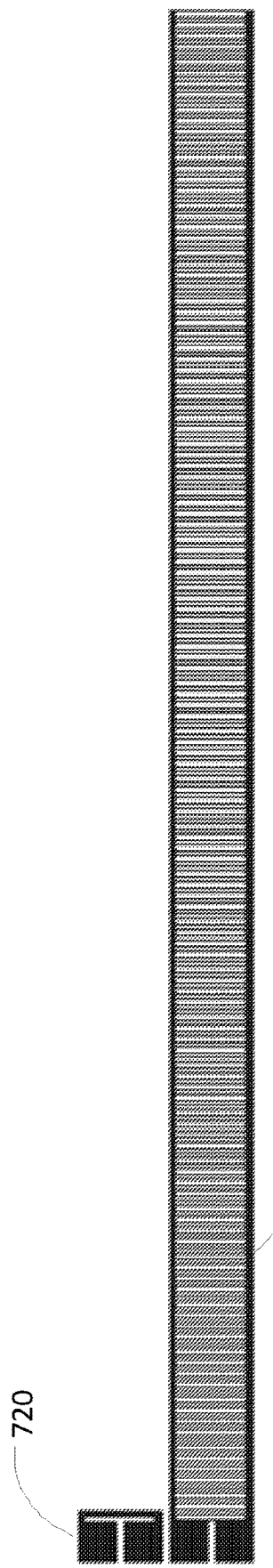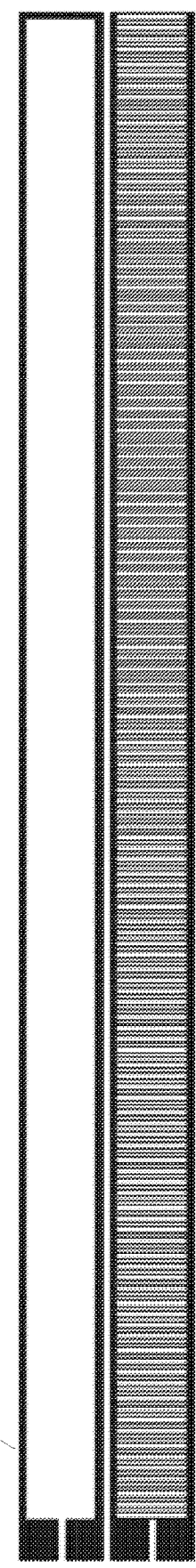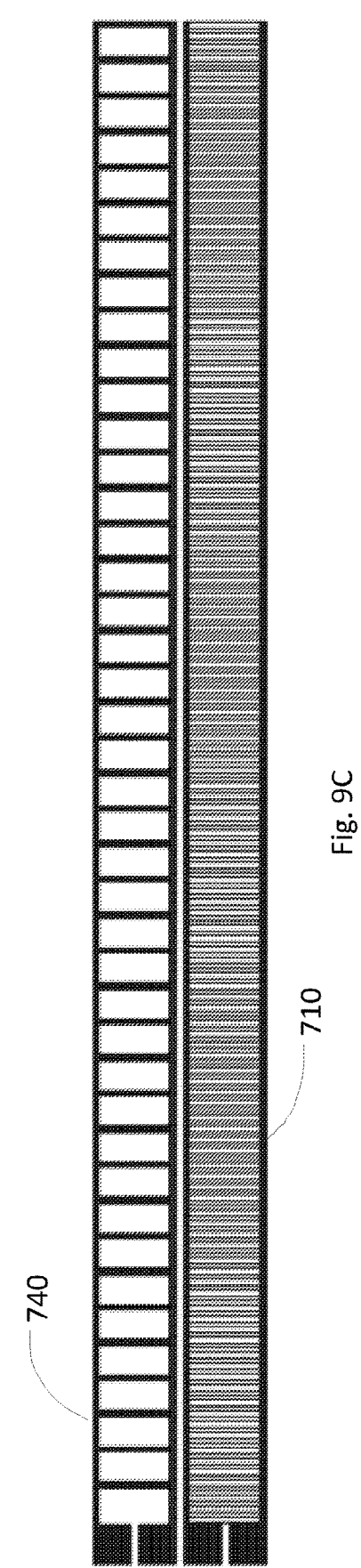

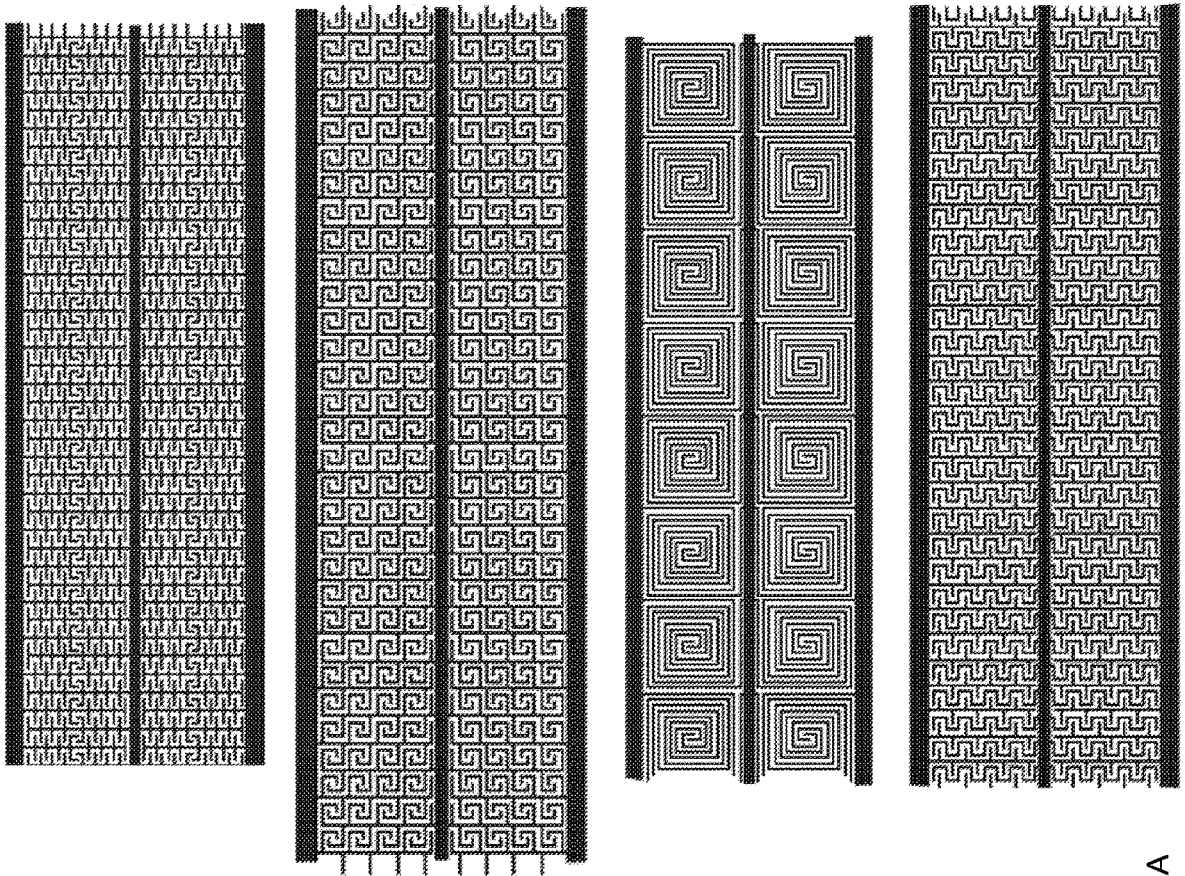
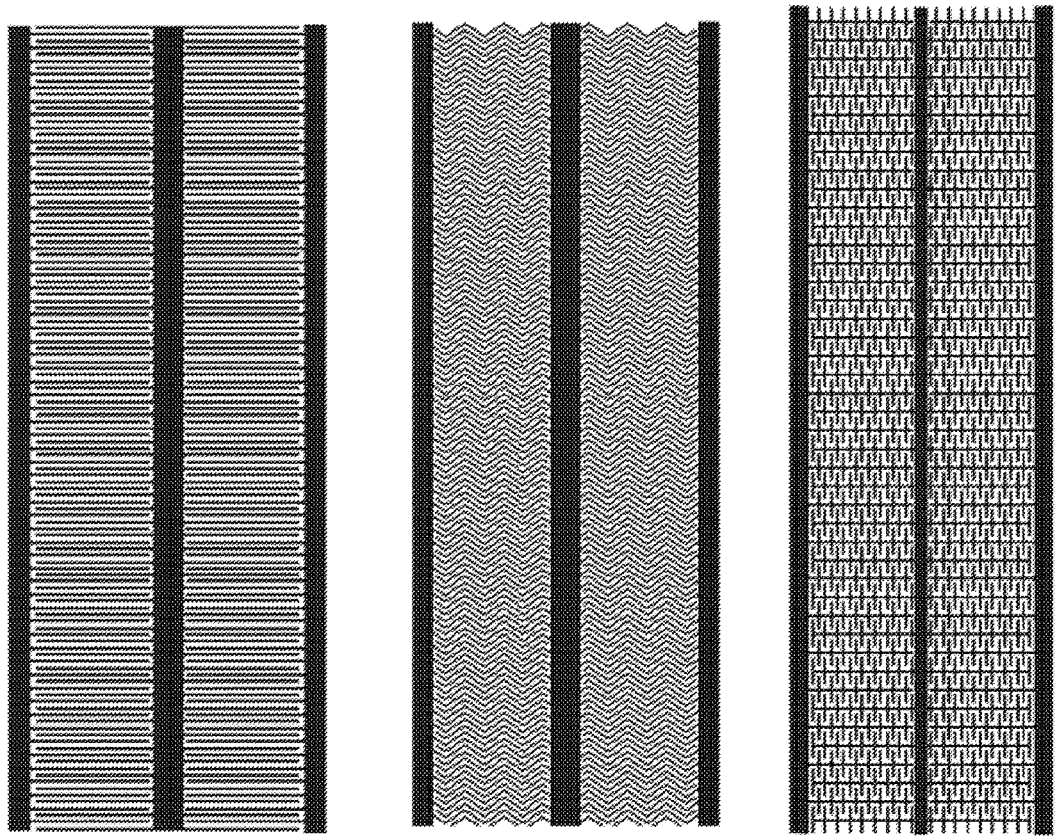
Fig. 10A

DIFFERENTIAL PEST SENSOR

CROSS-REFERENCE TO RELATED APPLICATIONS

This application is a national phase application of International Application No. PCT/GB2019/051845 filed on Jun. 28, 2019, which, in turn, is based upon and claims the right of priority to GB Patent Application No. 1810670.8 filed Jun. 28, 2018, GB Patent Application No. 1812109.5 filed Jul. 25, 2018, and GB Patent Application No. 1812477.6 filed Jul. 31, 2018, the disclosures of all of which are hereby incorporated by reference herein in their entirety for all purposes.

TECHNICAL FIELD

The present disclosure relates to pest sensors. In particular, but without limitation, this disclosure relates to differential pest sensors that monitor for bed-bug activity.

BACKGROUND

For many businesses it is important to be able to detect pest activity so that an outbreak can be dealt with appropriately. Hotels in particular have recently experienced an increase in the amount of bed bug activity, primarily caused by an increase in global travel and a decrease in the use of harmful pesticides. If the presence of bed bugs can be detected early, then it can be much easier to handle the outbreak.

Pest sensors can be used to identify the presence of one or more pests so that a pest control expert can be notified to handle the outbreak. Having said this, there is a need for more accurate sensing to avoid false alarms.

SUMMARY

Embodiments described herein provide improved pest detection circuitry through the use of differential sensing to avoid errors introduced via changes in environmental conditions. Further embodiments include detectors having multiple sets of sensing tracks for use in differential impedance sensing.

According to a first aspect there is provided a pest sensor comprising a processor configured to: receive a first signal indicative of a first impedance across a first sensing circuit; receive a second signal indicative of a second impedance across a second sensing circuit; and in response to detecting that one of the first or second signals differs from the other by more than a predefined difference threshold, output an indication of pest activity.

By detecting pest activity by monitoring for a large difference in the impedances measured across each sensing circuit, the sensor is able to account for impedance drift that can be caused by changes in environmental conditions (for instance, changes in humidity and temperature). This is particularly important if the sensing circuits are located on an absorbent substrate (or absorbent substrates), such as a paper-based substrate, such as paper, paperboard, card, fibreboard or cardboard. This is because sensing circuits on these types of substrate are more affected by environmental changes due to the absorbance of water within the substrate.

Detected pest activity can be any activity that causes a drop in impedance across one of the sensing circuits. This may be, for instance, via one or more pest droppings or via conduction through the pest itself. The pest may be a bed-bug or any other form of pest.

The pest activity may be detected on either of the sensing circuits. Accordingly, the pest sensor may be configured to output the indication of pest activity output in response to detecting that the magnitude of the difference between the first signal and the second signal is greater the predefined difference threshold. By taking the magnitude of the difference, the system can account for a drop in impedance from either sensing circuit.

To avoid false alarms being caused by short-term changes in impedance, the system may only trigger an alert in the event that the predefined difference threshold has been exceeded for more than a set time. According to an embodiment the indication of pest activity is output in response to detecting that the one of the first or second signals differs from the other by more than the predefined difference threshold for more than a predetermined period of time or for more than a predetermined number of consecutive measurements.

Once pest activity has been detected, it can be advantageous to continue outputting an alert, even if the conditions for pest detection are no longer satisfied. This ensures that the user is notified of prior pest activity. For instance, pest droppings may dry over time and therefore may become less conductive. In this case, the difference between the two signals would reduce over time, and possibly fall below the predefined difference threshold. To counter this, in one embodiment the processor is configured to, in response to detecting that the one of the first or second signals differs from the other by more than the predefined difference threshold, enter a triggered state and remain in the state until receiving an instruction to reset. The triggered state may include outputting an indication of pest activity, such as an alert, continually or intermittently until the system is reset.

According to an embodiment the indication of pest activity is output via a wireless interface to notify a central monitoring system and/or the indication of pest activity is output via an indicator on the pest sensor. The indicator may be a light emitting component such as an LED or display.

In addition to detecting pest activity, it can be advantageous to detect when the sensing circuits might have been compromised via damage. Damage can be in form of a short circuit (for instance, via water damage) or via a disconnection or break in the circuits.

According to an embodiment the processor is configured to, in response to detecting that both the first impedance and the second impedance are below the predefined threshold, output an indication that the first and second sensing circuits have been compromised by a short circuit. The system could detect that the first and second impedances are below the predefined threshold by detecting whether the signal indicative of impedance for each sensing circuit is below a corresponding threshold. The system might be configured to output the indication that the first and second sensing circuits have been compromised by a short circuit only if the first and second impedances are less than the predefined threshold for longer than a predefined period of time.

According to a further embodiment the processor is configured to output an indication that the first and second sensing circuits have been disconnected or broken in response to both the first impedance and the second impedance being greater than a further predefined threshold that is greater than the predefined threshold. The system could detect that the first and second impedances are above the further predefined threshold by detecting whether the signal indicative of impedance for each sensing circuit is above a corresponding further threshold. The first and second circuits being broken could be a break (such as a cut or tear) in the conductive tracks of the first and second circuits. The system might be configured to output the indication that the first and second sensing circuits have been disconnected or broken only if the first and second impedances are greater than the further predefined threshold for longer than a predefined period of time.

According to a further embodiment the pest sensor comprises circuitry for obtaining the first and second signals, the circuitry comprising a set of electrodes for connecting to first and second tracks of the first sensing circuit and to first and second tracks of the second sensing circuit, wherein the pest sensor is configured to measure the first signal across the first and second tracks of the first sensing circuit and to measure the second signal across the first and second tracks of the second sensing circuit.

The first signal may be measured across a first pair of electrodes and second signal measured across a second pair of electrodes. Alternatively, three electrodes may be used, with one electrode shared by first and second circuits.

According to an embodiment the set of electrodes comprise a shared electrode or a shared set of electrodes for connecting to the second tracks of the second tracks of the first and second sensing circuits wherein the second tracks are connected as a shared second track.

According to an embodiment the pest sensor comprises biasing circuitry configured to apply a voltage to the first tracks of the first and second sensing circuits, and to connect the second tracks of the first and second sensing circuits to ground. According to a further embodiment the pest sensor comprises biasing circuitry configured to apply a voltage to the second tracks of the first and second sensing circuitry, and to connect the first tracks of the first and second sensing circuits to ground.

Each voltage may be applied to each sensing circuit via a respective resistor. A voltage divider may be provided for each sensing circuit wherein the signal indicative of impedance across the sensing circuit may be the voltage measured at an output node of the respective voltage divider.

According to a further embodiment the pest sensor is configured to releasably connect to the first and second sensing circuits. This allows the first and second sensing circuits to be replaced in the event of being damaged or soiled (e.g. from pests).

According to a further embodiment the first and second sensing circuits form part of a detector and the pest sensor comprises a breakage sensor configured to connect to a pair of connected electrodes on the detector and to detect when the detector has been disconnected or broken in response to an increase in the loop resistance measured at the pair of connected electrodes. This provides an improved means of detecting disconnection or breakage that is affected less by changes in environmental conditions.

According to a further aspect there is provided a detector for use in a pest sensing system, the detector comprising first and second sensing circuits, each comprising: a first electrode connected to a first track running along a longitudinal direction; a second electrode connected to a second track running substantially parallel to the first track; and sensing tracks. The sensing tracks are in the form of a set of fingers located between the first and second tracks, a first set of the fingers being connected to the first track only and reaching towards the second track, and a second set of the fingers being connected to the second track only and reaching towards the first track, the first and second sets of fingers being interdigitated with each other and separated from each other such that pest activity can be detected via a reduction in the impedance between the two sets of interdigitated fingers, measured via the first and second electrodes.

By providing multiple sensing circuits, pest activity can be detected via changes in the difference between the impedances measured across the two circuits. This allows pest activity to be detected more accurately with a reduced chance of false alarms caused by changes in environmental conditions. The interdigitated fingers provide a large area in which pest activity may be detected via the two sets of fingers being shorted.

The pest activity may be measured at either of the first or second sensing circuits. Accordingly, in one embodiment at least one of the first and second sensing circuits is exposed such that pests may access the interdigitated fingers.

The circuitry may be formed out of conductive ink printed onto a substrate. This provides a simple and inexpensive means of manufacturing the detector so that it may be easily replaced in the event that it is damaged or soiled. The substrate may be formed of a paper-based material such as paper, paperboard, cardboard or fibreboard.

According to a further embodiment at least a portion of each finger runs in a direction that has at least some component that is in the longitudinal direction. According to a further embodiment the interdigitated fingers have complimentary zig-zag patterns running substantially along the transverse direction and providing alternating positive and negative longitudinal components.

According to a further embodiment the detector comprises a set of channels formed over at least one of the first and second sensing circuits and running along the transverse direction to direct pests to pass over the at least one of the first and second sensing circuits.

By directing pests in a first direction and having tracks that run at least partially across that direction, the detector is more likely to detect pest activity such as pest droppings. This is because pest droppings are likely to be elongated in the direction of movement of the pest. By providing fingers that have at least a portion that is perpendicular to the direction of motion, the droppings are more likely to connect the two sets of fingers thereby causing a detectable drop in impedance.

The channels could be tunnels (e.g corrugations formed, for instance, from corrugated card) or a set of opposing walls that are open at the top. According to an embodiment the set of channels run perpendicular to the longitudinal direction. This directs pests to run along a transverse direction whilst the longitudinal elements increase the chance of detection.

According to an embodiment the second track of the first sensing circuit is connected to the second track of the second sensing circuit to form a combined central track running along the longitudinal direction. This provides a more efficient use of space on the detector and allows connection to a simpler biasing circuit.

According to an embodiment the pest sensor comprises a breakage detection circuit comprising one or more conductive loops connected between a pair of electrodes such that breakage or disconnection of the detector can be detected via a change in loop resistance measured across the pair of electrodes. This provides a simple and effective means of detecting breakage or disconnection that is impacted less by changes in environmental conditions.

According to an embodiment the breakage detection circuit comprises a plurality of conductive loops, each of a different length to the other, extending along the longitudinal direction. The plurality of loops allows a break or disconnection to be detected even after the detector has been cut to a shorter length.

According to an embodiment the loops are formed by two parallel tracks running along the longitudinal direction and connected by a succession of transverse connectors located at various distances along the longitudinal direction.

According to a further embodiment there is provided a pest sensing system comprising a pest sensor as described herein and a detector as described herein.

BRIEF DESCRIPTION OF THE DRAWINGS

Arrangements of the present invention will be understood and appreciated more fully from the following detailed description, made by way of example only and taken in conjunction with drawings in which:

FIGS. 1A-1C show perspective, side and cross-sectional views of various sections of a pest sensor system according to an embodiment;

FIG. 7 shows how impedance across each sensing circuit changes over time for various detection scenarios;

FIGS. 9A-9C show breakage detection circuitry for a sensor strip according to an embodiment; and FIGS. 10A-10C show various patterns for interdigitated fingers for a sensor strip according to an embodiment.

DETAILED DESCRIPTION

Figure 2A:
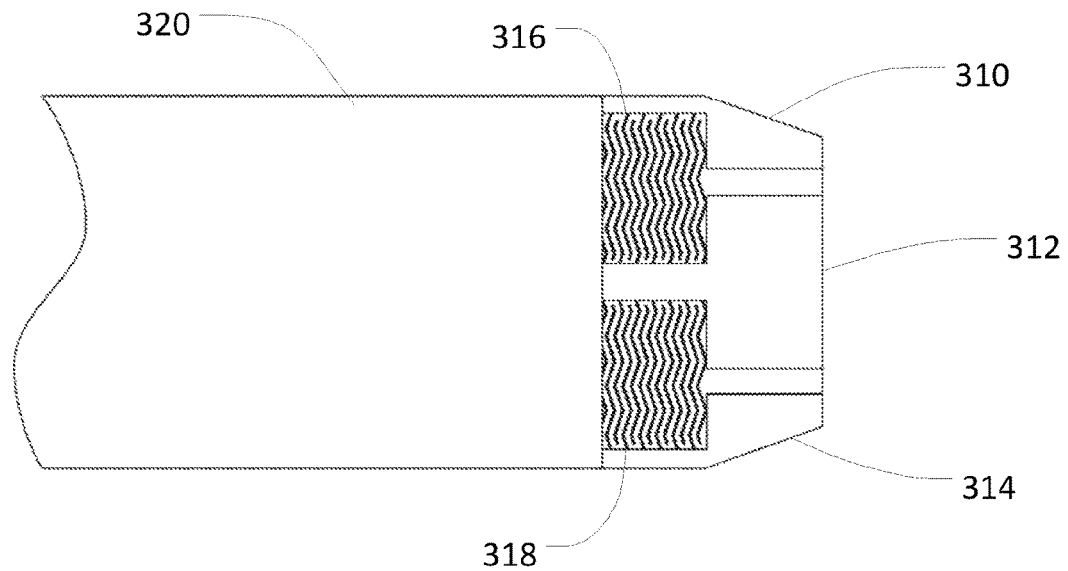
FIGS. 2A and 2B show a sensor strip for a pest sensor system and the underside of a pest sensor unit according to an embodiment.

Embodiments described herein provide a more effective means of detecting pest activity. The embodiments make use of impedance sensing to detect pest activity, such as pest droppings. Given that the impedance of an open circuit can vary quite significantly based on environmental conditions such as temperature or humidity, various embodiments make use of differential sensing to avoid false alarms in such situations. In addition, embodiments provide more effective sensing patterns for detecting moving pests.

FIGS. 1A-1C show perspective, side and cross-sectional views of various sections of a pest sensor system 50 according to an embodiment.

FIG. 1A shows a perspective view of a pest sensor system according to an embodiment. The pest sensor system comprises a pest sensor 50 and a sensor strip 300. The pest sensor 50 is formed of two parts, an outer housing 100 and a sensor unit 200.

The sensor strip 300 is a flat strip having pest sensing tracks on one surface. The sensor strip 300 may be also called a detector strip. In the present embodiment the sensor strip 300 is formed of a flexible substrate. This may be paper, card, plastic or any other flexible substrate. The pest sensing tracks may be deposited onto the surface, e.g. via printing or deposition, or may form part of the substrate and may be exposed, for instance, via etching. In the present embodiment, the tracks are formed from conductive ink printed onto the substrate.

The sensor unit 200 is configured to be secured within the outer housing 100. The pest sensor 50 is configured to secure one end of the sensor strip 300 between the outer housing 100 and the sensor unit 200 via a clamping action.

FIG. 1B shows the underside of the sensor unit 200. The underside of the sensor unit 200 is clamped against the sensor strip 300 when the sensor unit 200 is secured within the outer housing 100.

FIG. 1C shows a top-down view of the inside of the outer housing 100 with the sensor strip 300 held therein. The outer housing comprises a holder 150 configured to receive and hold the sensor strip 300 via an interference fit. The sensor unit 200 may then be locked into place within the outer housing 100 thereby clamping the sensor unit 200 against the sensor strip 300 to secure the sensor strip 300 within the pest sensor 50. This action also secures electrodes on the underside of the sensor unit 200 against corresponding electrodes on the sensor strip 300 forming an electrical connection between the sensor unit 200 and the sensor strip 300. This therefore allows the sensor unit 200 to measure the impedance across the pest sensing tracks to detect pest activity.

Figure 2B:
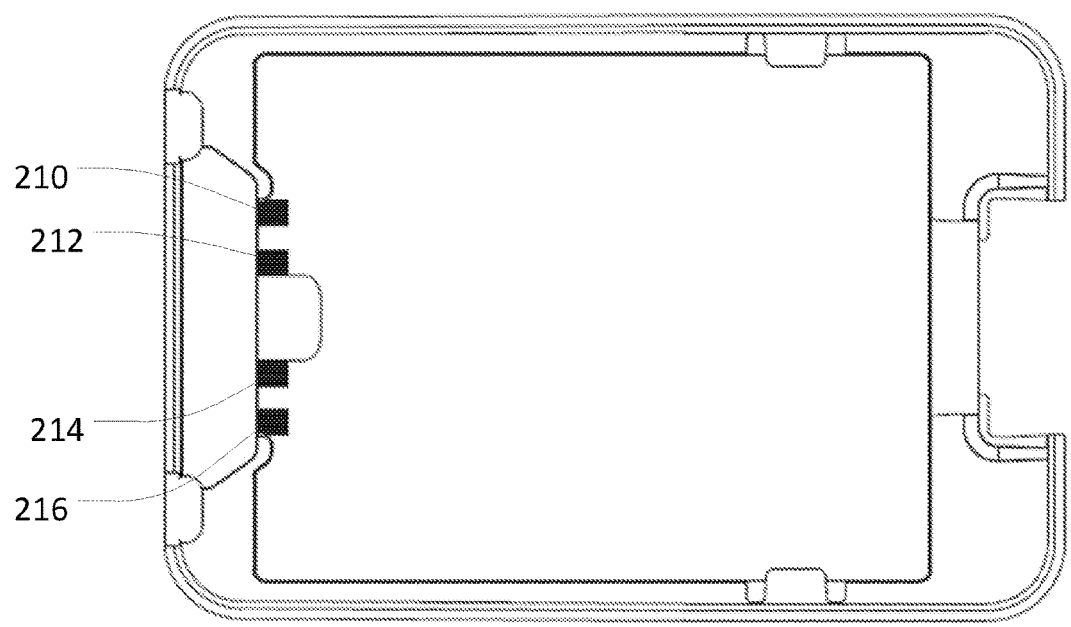

FIGS. 2A and 2B show a sensor strip 300 for the pest sensor system 50 and the underside of the sensor unit 200 according to an embodiment.

FIG. 2A shows a proximal end of the sensor strip 300. The sensor strip 300 is substantially rectangular with a longitudinal axis running down its length. The sensor strip 300 comprises pest sensor circuitry comprising first and second sensing circuits. The sensing circuitry may be formed of conductive ink printed onto a flexible substrate. The substrate may be formed of a paper-based material such as paper, paperboard, fibreboard or cardboard.

First 310 and second 314 outer electrodes and a central electrode 312 are located at the proximal end of the sensor strip 300. The proximal end is configured to fit and be secured within the pest sensor 50.

The central electrode 312 is located between the first 310 and second 314 outer electrodes. Each electrode 310-314 is connected to a corresponding longitudinal track that runs down the length of the sensing circuit. The longitudinal tracks run in parallel to each other. Accordingly, the first outer electrode 310 has a corresponding first outer longitudinal track, the second outer electrode 312 has a corresponding second outer longitudinal track and the central electrode 314 has a corresponding central longitudinal track.

In the present embodiment the central electrode 312 and central longitudinal track is shared between the first and second sensing circuits. The central electrode 312 acts as a common electrode that may either be set to ground with the outer electrodes being biased, or vice versa. Accordingly, the first sensing circuit is formed between the first outer electrode 310 and the central electrode 312 and the second sensing circuit is formed between the second outer electrode 314 and the central electrode 312.

Each sensing circuit comprises sensing tracks 316, 318 in the form of a set of interdigitated fingers located between the corresponding pairs of longitudinal tracks. Accordingly, the first sensing circuit comprises a first set of interdigitated fingers 316 located between the first outer longitudinal track and the central longitudinal track. The second sensing circuit comprises a second set of interdigitated fingers 318 located between the second outer longitudinal track and the central longitudinal track.

Each set of interdigitated fingers comprises a first set of fingers wherein each finger is connected only to the corresponding outer longitudinal track and a second set of fingers wherein each finger is connected only to the central longitudinal track. The first and second sets of fingers alternate along the length of the sensor strip 300. That is, the fingers are alternately connected to the central longitudinal track and to the corresponding outer longitudinal track.

This arrangement provides a pair of sensing circuits that are initially broken (as the interdigitated fingers do not connect between the central and corresponding outer longitudinal tracks). The circuit may be completed by a pest connecting the two sets of fingers together. This may be achieved by a dropping (otherwise known as a "spot") of a pest which can form a conductive connection between the two sides of the sensing circuit. As the fingers are interdigitated, there is a large detection area where a dropping may be detected.

The present embodiment is directed towards a bed bug sensor. Beg bugs are attracted to tight spaces (refuges) as this provides protection. To attract bed bugs towards the sensing circuitry, a set of tunnels are formed above the sensing circuitry running transverse across the sensor strip 300. In the present embodiment, cardboard corrugations (or fluting) 320 are attached to the sensing circuitry. This can be achieved by attaching the middle and top layers of corrugated cardboard to the sensor strip 300. The corrugations form channels or tunnels running across the width of the sensor strip 300 (parallel to the longitudinal tracks). Bed bugs are attracted to cardboard and to tight spaces and are therefore likely to hide within the corrugations thereby increasing the likelihood of them leaving droppings on the sensing circuitry and being detected. FIG. 2B shows the underside of the sensor unit 200 according to an embodiment. A PCB comprising detection circuitry is secured within the sensor unit. Four electrodes 210, 212, 214 and 216 are located on the underside of the PCB, at one end of the PCB. When the sensor unit 200 is clamped against the sensor strip 300, the electrodes 210, 212, 214 and 216 are urged against the electrodes 310, 312, 314 on the sensor strip 300 thereby forming an electrical connection between the sensor unit 200 and the sensor strip 300 so that the sensor unit 200 may monitor the impedance across the two sensing circuits.

In this embodiment, four electrodes 210, 212, 214 and 216 are provided on the sensor unit 200, with two central electrodes 212 and 214 connecting to the central electrode 312 of the sensor strip 300. When the sensor unit 200 is secured within the outer housing 100, the two central electrodes 212, 214 straddle the holder 150. Having said this, two central electrodes are not essential, and in alternative embodiments only one central electrode may be provided for connecting to the central electrode 312 of the sensor strip 300. Alternatively the sensor strip 300 may comprise two separate sensing circuits, each having their own, separate pair of longitudinal tracks (rather than sharing a central track). In this embodiment, four electrodes are required each of the sensor strip 300 and sensor unit 200.

Whilst the embodiment of FIG. 2A has longitudinal tracks running down the length of an elongated strip and transverse fingers running across the width of the strip, the geometrical arrangement of these components may be changed depending on the requirements of the system. Furthermore, it is not essential for the sensor circuitry to be located on a strip and, but instead, the circuitry can be located on any flat surface, provided that the sensor unit electrodes can be connected to the corresponding electrodes in the sensing circuitry.

For ease of use, the strip 300 may be formed of a flexible substrate such as paper or cardboard so that it may be cut to shape to fit within areas of likely pest activity, and cheaply and easily disposed of and replaced after use. The corrugation may be added to the substrate either prior to or after cutting the strip 300 to shape. Having said this, depending on the geometric arrangement of the fingers, cutting the strip 300 to reduce its length might disconnect a number of the fingers still remaining after cutting.

Figure 3A:
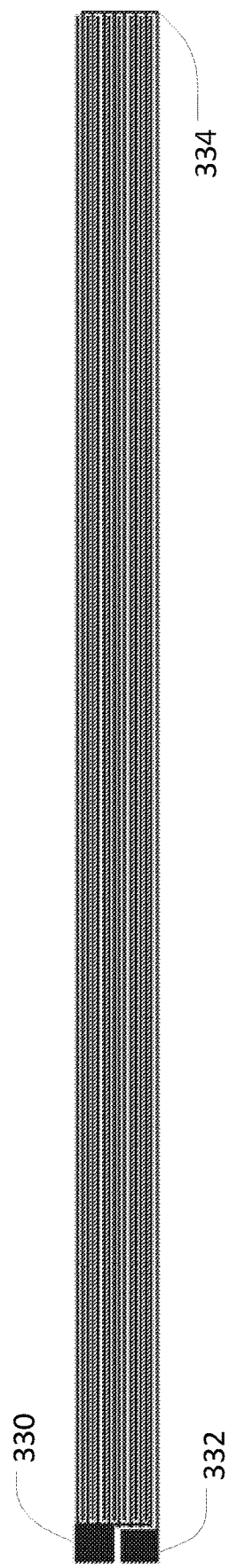
FIGS. 3A and 3B show a comparison between a sensor strip having longitudinal interdigitated fingers and a sensor strip having transverse interdigitated fingers.
Figure 3B:
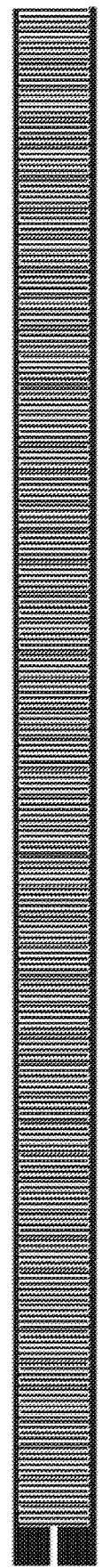

FIGS. 3A and 3B show a comparison between a sensor strip having longitudinal interdigitated fingers and a sensor strip having transverse interdigitated fingers. For simplicity, the strips show only a single sensing circuit, rather than the two sensing circuits shown elsewhere.

FIG. 3A shows a sensor strip having longitudinal interdigitated fingers running down the length of the strip. In this case, first 330 and second electrodes 332 are located at a proximal end of the strip. A first set of the interdigitated fingers is connected to the first electrode 330 at the proximal end of the strip. In contrast, the second set of the interdigitated fingers must be connected to the second electrode 332 at the distal end of the strip via a connector 334 that runs down the side of the strip and across the distal end of the strip.

If the system is cut down, the connector 334 would be severed and therefore the second set of the interdigitated fingers would all be disconnected from the second electrode 332. The whole sensor would then be unusable.

FIG. 3B shows a sensor strip having transverse interdigitated fingers. Rotating the detection fingers by 90 degrees allows the detector to be cut down without compromising functionality.

The corrugations run perpendicular to the length of the sensor strip. This increases the number of channels, and therefore increases the chance of a bed bug being detected. The beg bugs are encouraged to move across the sensor strip (along the transverse direction, perpendicular to the longitudinal direction). Bed bug droppings can become elongated in the direction of movement of the bed bug. As the fingers also run along this direction, there is a risk that a bed bug dropping might not be wide enough (due to the elongation) to connect the two sides of the sensing circuit.

To counter the above problems, a degree of meandering may be introduced along the detector fingers to achieve a compromise between improved spotting detection and reduced damage caused by cutting. The fingers are therefore arranged to have sections that cross the corrugations (the direction of travel of the pest). This may be in the form of sections that travel in a direction that has at least a component in that is perpendicular to the direction of the corrugations. This may be via diagonal sections or via sections that run perpendicular to the corrugations.

Figure 4A:
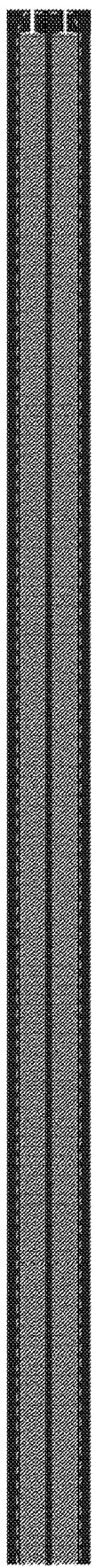
FIGS. 4A and 4B show a sensor strip for use with a pest sensor according to an embodiment.
Figure 4B:
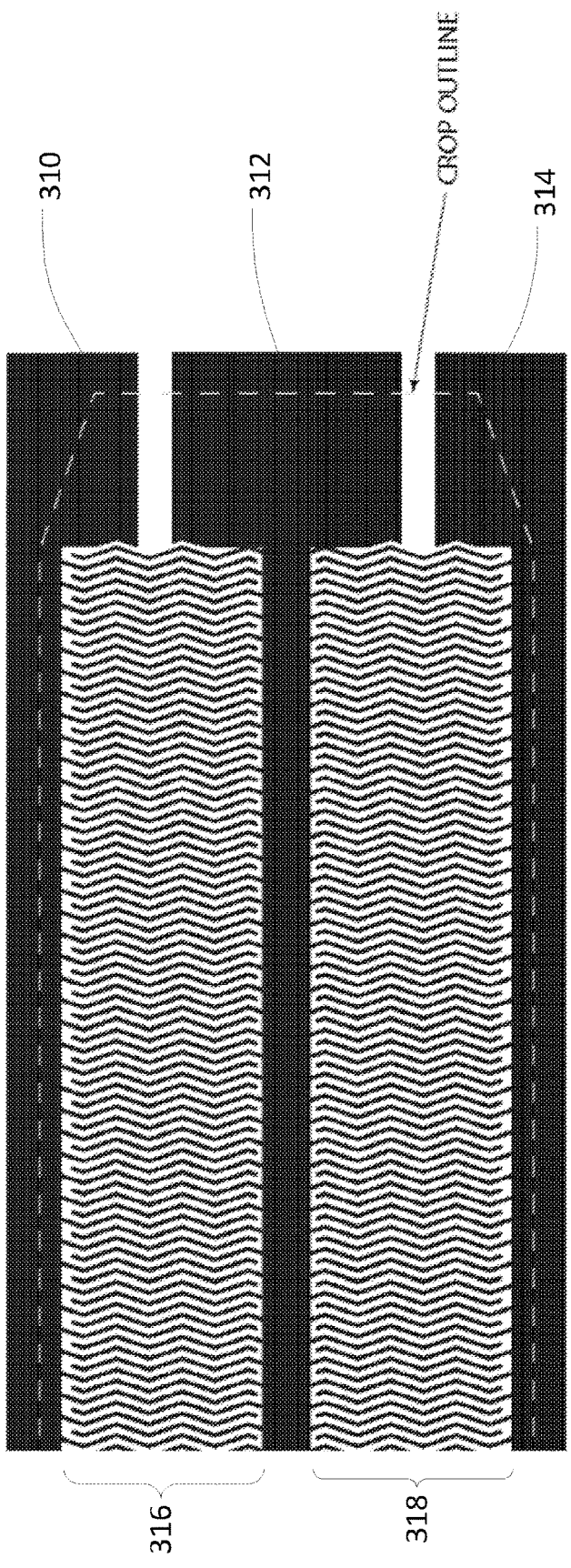

FIGS. 4A and 4B show a sensor strip 300 for use with a pest sensor according to an embodiment.

To increase the chance of a bed bug dropping connecting two adjacent interdigitated fingers, the present embodiment provides the fingers with sections that cross the corrugations (tunnels). In the present case, the tracks form a zig-zag pattern across the width of the respective sensing circuit. Whilst the tracks still run substantially along the transverse direction (extending between the two adjacent longitudinal rails), the slight longitudinal component introduced by the zig-zag pattern increases the chance that a dropping will connect adjacent tracks and thereby short the circuit.

It is advantageous to keep the interdigitated fingers substantially perpendicular to the length of the sensor strip. This is because increasing the longitudinal component of the tracks increases the number of unusable tracks in the event that the strip is cut to reduce its length.

Figure 5:
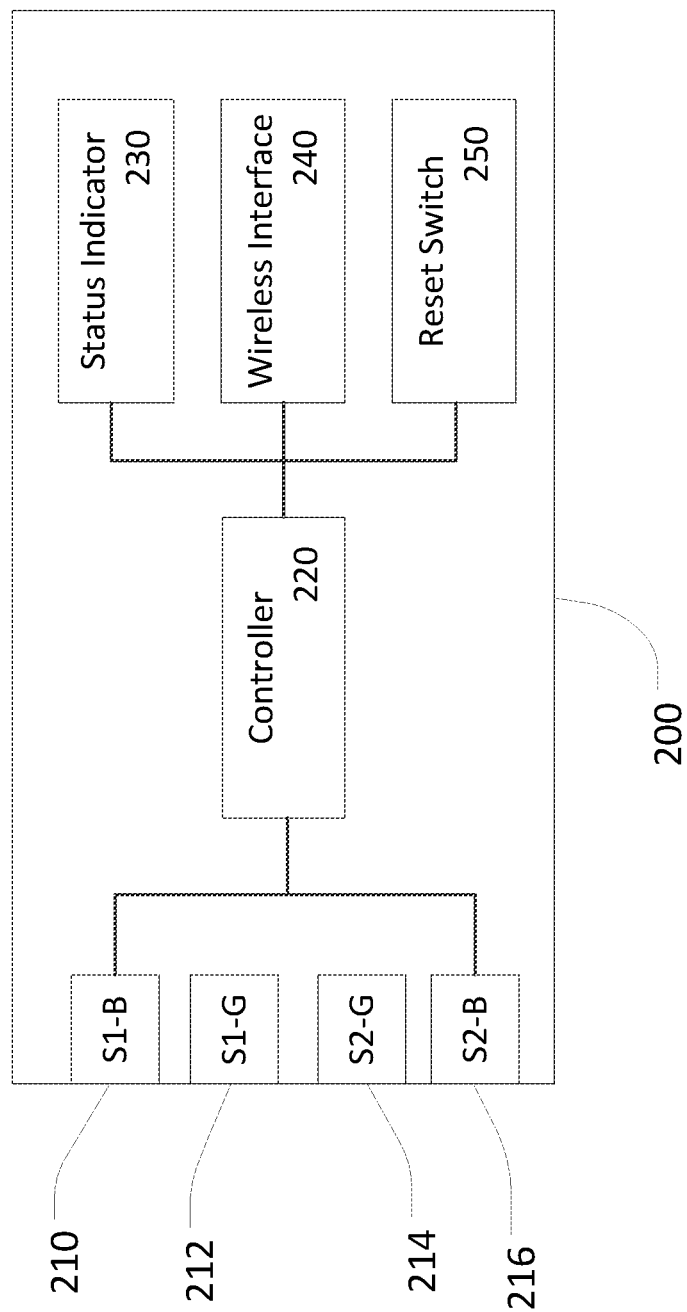
FIG. 5 shows components of a pest sensor according to an embodiment.

FIG. 5 shows components of a pest sensor 200 according to an embodiment. The pest sensor 200 comprises a bias electrode 210 and ground electrode 212 for the first sensing circuit and a bias electrode 216 and ground electrode 214 for the second sensing circuit. The bias electrodes 210 and 216 are connected to a controller 220 whilst the ground electrodes 212, 214 are connected to ground. The controller 220 is connected to a status indicator 230, a wireless interface 240 and a reset switch 250.

The controller 220 is a processor that is configured to monitor the impedance over the first and second sensing circuits. The controller 220 is configured to detect pest activity based on changes in impedance in the sensing circuits. The controller 220 is configured to output signals via the status indicator 230 and wireless interface 240 to alert users to the detected pest activity. When pest activity is detected, the controller enters a triggered state and only returns to a sensing state once a reset command is received from either the reset switch 250 or the wireless interface 240.

The controller 220 is also configured to monitor the integrity of the sensor strip 300 and output an indication that the strip 300 has been damaged when this has been detected. This may be output via the status indicator 230 or wireless interface 240.

The status indicator 230 is configured to provide a visible indication of the status of the system. For instance, the status indicator may be a light (such as a light emitting diode, LED) or a display, with the status being indicated, for instance, by a colour or pattern of flashing of the indicator.

The wireless interface 240 is configured to connect to a local base station and to exchange signals with a central control system. This allows the pest sensor system to report activity and/or damage to a user monitoring the central control system, thereby avoiding the need for regular physical checks of the pest sensor system, and to receive commands from the central control system, such as reset commands.

The reset switch 250 might be a mechanical switch or may be a magnetic switch, to avoid the use of moving parts and to avoid the system being reset accidentally. For instance, the where a magnetic switch is used the system may be reset by the user placing a magnet against the magnetic switch.

The system is powered by a power source such as a battery located within the sensor unit 200.

Figure 6:
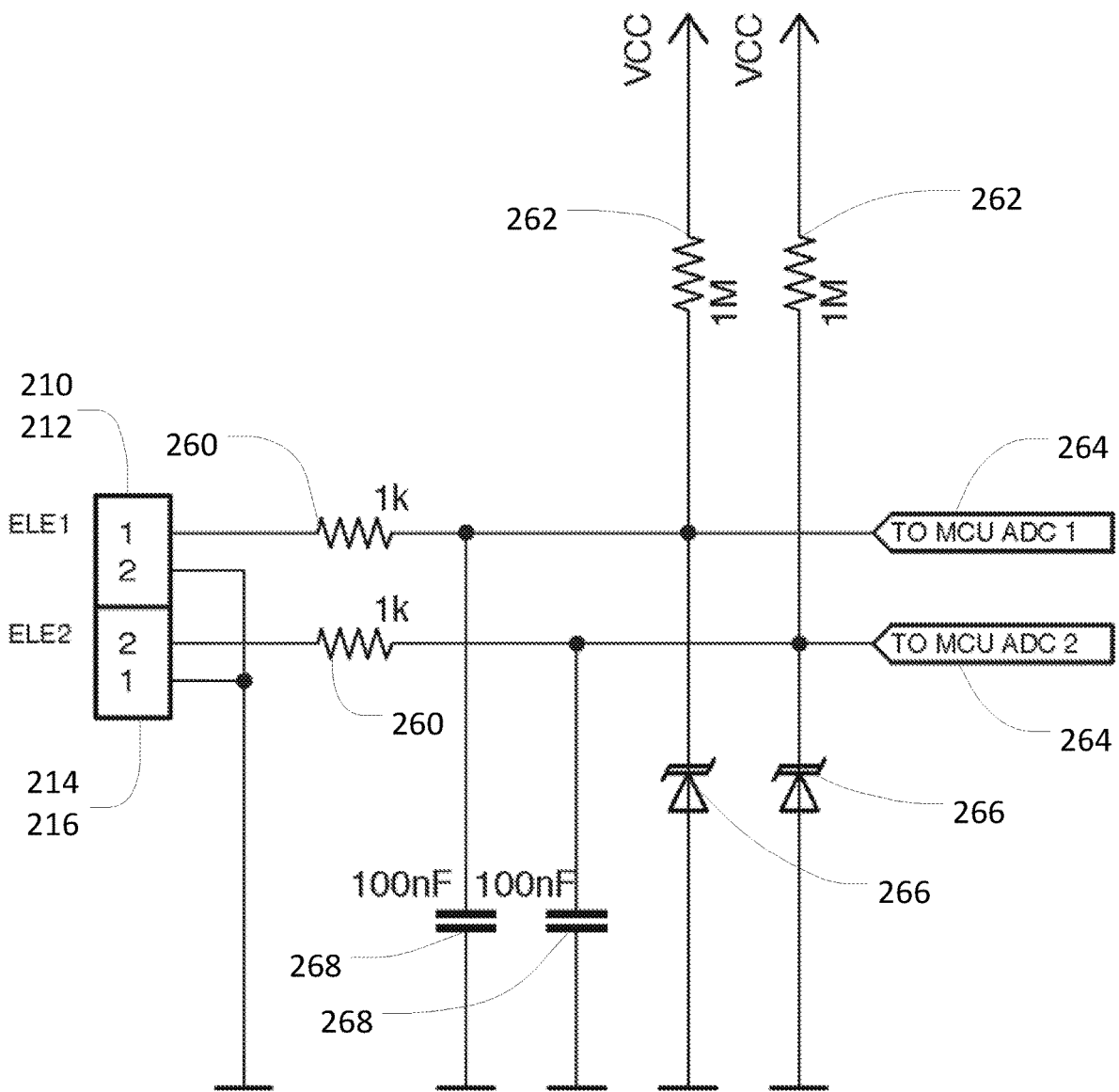
FIG. 6 shows a circuit diagram of analogue detection circuitry of a pest sensor according to an embodiment.

FIG. 6 shows a circuit diagram of analogue detection circuitry of a pest sensor according to an embodiment.

A bias electrode 210, 216 and a ground electrode 212, 214 are provided for each sensing circuit to which the sensor unit is to connect. The system makes use of a voltage divider over which the impedance of each sensing circuit is measured. Each ground electrode 212, 214 is connected to ground. The bias electrodes 210, 216 are connected, in parallel, to a bias voltage (VCC). In the present embodiment, the bias voltage is set to 3.3V; however, alternative bias voltages may be used.

Each bias electrode 210, 216 is connected to the bias voltage via a respective first resistor 260 (in this case, of 1 kΩ) and a respective second resistor 262 (in this case of 1MΩ). For each pair of electrodes, an output node 264 is connected between the first 260 and second 262 resistors. The voltage across the respective sensing circuit is measured at this output node for use by the controller 220 in monitoring changes in impedance.

Each output node 264 is connected to ground via a corresponding transient voltage suppression (TVS) diode 266. This provides protection against voltage spikes.

In addition, each output node is connected to ground, in parallel to the corresponding diode 266, via a corresponding capacitor 268 (in this case, of 100 nF). This filters out high frequency noise within the system.

The combination of the second resistors 262 (the bias resistors), output nodes 264 and the electrodes 210-216 form a pair of voltage dividers. The impact of the first resistors 260 is negligible due to their relatively low resistance. Accordingly, the voltage ($V_{out}$) at each output node 264 is:

$$V_{out} = VCC \times \frac{R_D}{R_D + R_B}$$

where $R_B$ is the resistance of the second resistor (the bias resistor) and $R_D$ is the resistance across the respective sensing circuit.

The controller 220 makes use of the voltage ratio (otherwise known as the transfer function) for each sensing circuit to determine various states of the circuits. The voltage ratio is:

$$H = \frac{V_{out}}{VCC} = \frac{R_D}{R_D + R_B}$$

as $R_B$ is 1MΩ, then the transfer function (for resistance measured in MΩ) is:

$$H = \frac{R_D}{1 + R_D}$$

As the sensing circuits are dealing primarily with direct current, there will be very little reactance, so the impedance over each sensing circuit should be generally equal to the resistance over the sensing circuit.

The voltage ratio is measured at each output node 264 as a value that is indicative of the impedance of the respective sensing circuit. As the impedance increases, the voltage ratio increases, and vice versa.

The voltage ratio from each output node 264 is passed through an analogue to digital converter and the digital value is supplied to the controller 220 for analysis. The controller 220 is configured to determine various states of the system, including whether pest activity has been detected, and whether one or both of the sensing circuits have been damaged.

FIG. 7 shows how impedance across each sensing circuit changes over time for various detection scenarios. Four plots are shown, with impedance on the y-axis and time on the x-axis. Two plots are shown, one for each of sensing circuits.

The top left plot shows a situation where the sensor strip 300 is torn or disconnected. In this situation, the circuit is fully broken. There is a certain degree of leakage current when a functioning sensor strip 300 is connected. Accordingly, when the sensor strip 300 is disconnected, or where the circuit is broken, then both impedances will increase permanently. The controller 220 is configured to detect when both impedances pass an upper impedance threshold (an open threshold) and, in response, determine that the circuit has been broken (damaged via an opening in the circuit). In this case, an alert corresponding to this determination is issued via the wireless interface 240 and the damaged via an opening in the circuit is indicated via the status indicator 230.

If the sensor strip is damaged via water (or another conductive material or solvent), then both impedances will decrease permanently (see top right plot). This is due to the circuit being completed by the conductive material. Whilst the water may dry, the water can cause the conductive ink to run and therefore connect the two halves of the sensor circuit. The controller 220 is configured to detect when both impedances pass a lower impedance threshold (a short threshold, lower than the open threshold) and, in response, determine that the circuit has been damaged via a short circuit. In this case, an alert corresponding to this determination is issued via the wireless interface 240 and the damaged via a short circuit status is indicated via the status indicator 230.

In contrast to the above, where pest activity is detected, only one of the sensing circuits will be affected due to the localisation of the activity (see bottom left plot). In the present case, a bed bug spot would connect the adjacent detector fingers in only one of the two sensing circuits. This would be characterised by a drop in impedance for one, but not both, of the sensing circuits. Accordingly, the controller 200 is configured to detect a change in the difference in the impedance of the two sensing circuits. If this magnitude is greater than a predefined difference threshold (detection threshold), then the controller 220 determines that there has been pest activity and outputs the corresponding status alerts via the status indicator 230 and wireless interface 240. To account for positive and negative differences, the magnitude of the difference between the two impedances is used.

Where a pest dropping contains conductive material (such as iron from blood) or where the dropping causes the ink of the fingers to run and connect the circuit, the change in impedance will be permanent (as shown in the bottom left plot). Having said this, if the dropping is small enough, the circuit may be disconnected when the spot dries. This is shown in the bottom right plot where the impedance of one of the sensing circuits drops relative to the other before returning to its previous value. In light of this, the controller 220 latches into its particular state. Accordingly, when pest activity has been detected, the controller 220 stays in the state for detected pest activity until it receives a command to reset.

It will be appreciated that, whilst the above discusses controller monitoring changes in impedance, the same functionality could equally be applied by setting thresholds for the voltage ratio and a threshold for the maximum difference in the voltage ratio. Accordingly, an open threshold and short threshold may be applied to voltage ratio. Both thresholds are indicative of changes in impedance.

Equally, parameters other than voltage ratio but still indicative of the impedance can be used for monitoring the status of the sensing circuits.

It should be noted that it is possible for the impedances to diverge temporarily even through there is no pest activity present. Accordingly, embodiments take a number of measurements and determine the relevant status based on the relevant criteria being satisfied for a predetermined number of consecutive measurements.

Whilst both sensing circuits may be exposed and therefore available to detect pest activity, it is possible to implement the sensing methods described herein with one sensing circuit exposed (via the corrugations) so that pest activity can be detected and the other sensing circuit being completely covered (such that pests cannot access the other sensing circuit) so that this other sensing circuit is used solely as a reference to account for changes in environmental conditions.

Figure 8:
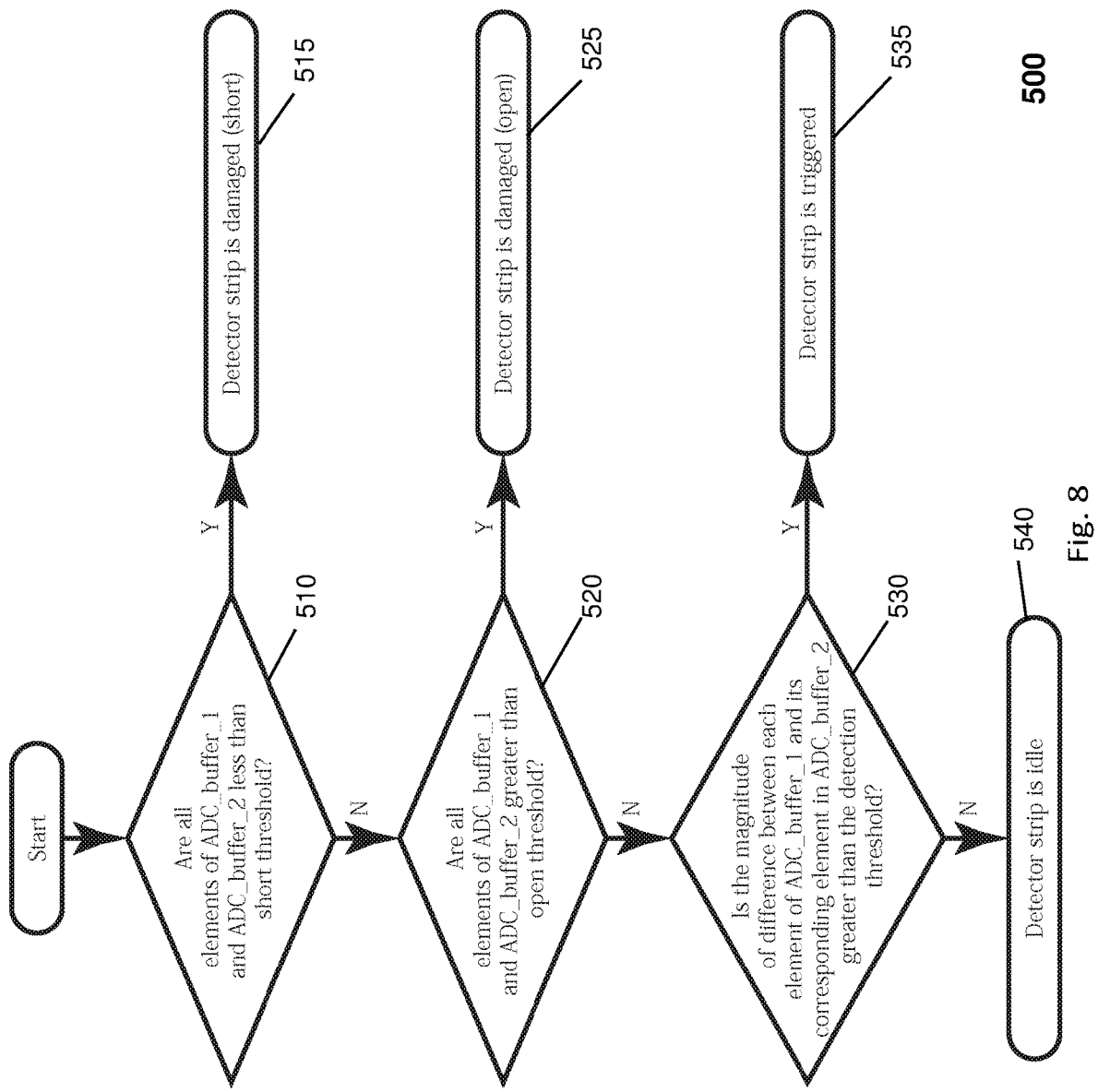
FIG. 8 shows a flow diagram for a pest sensing method according to an embodiment.

FIG. 8 shows a flow diagram for a pest sensing method according to an embodiment. This method may be implemented via software within the controller or by hardware configured for this particular function.

Measurements are taken periodically. In the present embodiment, a measurement is taken every 30 s; however, different sample frequencies may be utilised.

As discussed above, the voltage ratio for each sensing circuit is converted into a digital value. This digital value is stored in a corresponding buffer (ADC_buffer_1 for the first sensing circuit and ADC_buffer_2 for the second sensing circuit). For convenience, this digital value shall be referred to as the voltage ratio below.

The controller 220 waits until the predefined number of measurements have been stored in local storage (the buffer). In the present case, the predefined number of measurements is three.

It then determines whether all of the elements in both buffers (the predefined number of elements for both sensing circuits) are less than the lower threshold (the short threshold) 510. If so, then the controller determines that the detector strip has been damaged by a short circuit 515. This status is output by the controller 220 which waits for an engineer to repair the damage and reset the system.

If all of the elements in both buffers are not less than the short threshold then the controller 220 determines that no short has been detected, and moves on to determine whether all elements in both buffers are greater than the upper threshold (the open threshold) 520. If so, then the controller 220 determines that the detector strip is damaged via an opening in the circuit (e.g. disconnected or broken) 525. This status is output by the controller 220 which waits for an engineer to repair the damage and reset the system.

If all of the elements in both buffers are not greater than the open threshold 520 then the controller 220 determines that no damage has been detected and moves on to determine whether the magnitude of the difference between each element of the first buffer and its corresponding element in the second buffer is greater than the detection threshold 530. If the magnitude of the difference for each pair of measurements is greater than the detection threshold, then the controller determines that there has been pest activity 535. This status is output by the controller 220 which waits for a pest control specialist to review the situation, replace the detector strip and reset the system.

If the magnitude of the difference between each pair of measurements is not greater than the detection threshold, then the controller 220 determines that no pest activity or damage has occurred and enters an idle state 540 until the next set of measurements is scheduled. When the next pair of measurements is taken then these are added to the respective buffers. The controller 220 repeats the method of FIG. 8 to determine a new status based on the most recent set of measurements (e.g. the three most recent measurements).

In an alternative embodiment, instead of determining whether one of the above thresholds has been exceeded for a predetermined number of measurements the controller determines whether the threshold has been exceeded for more than a predetermined time.

FIGS. 9A-9C show breakage detection circuitry for a sensor strip according to an embodiment.

FIG. 9A shows a sensor strip having a sensing circuit 710 and a connection circuit 720. The connection circuit 720 comprises a pair of electrodes connected via a short loop. The sensor unit 200 is configured to connect to these electrodes and measure the impedance across these electrodes. When the loop resistance is low (below a threshold), the sensor unit 200 determines that the sensor strip is connected. This provides feedback to the operator to let them know that they have correctly connected the sensor strip.

FIG. 9B shows a sensor strip having a sensing circuit 710 and a break detection circuit 730. The break detection circuit 730 is much like the connection circuit 720; however, the loop extends down the length of the strip. Accordingly, the break detection circuit 730 allows the sensor unit to detect when the strip has been broken or torn. When the loop resistance is low then the sensor unit 200 determines that the sensor strip is connected and unbroken. If the loop resistance increases above a threshold, then the sensor unit 200 determines that the sensor strip has been damaged through a breakage.

This provides a more effective break detection mechanism than using the impedance from the sensing circuit 710, as the impedance from the sensing circuit 710 is liable to change by quite a large margin based on environmental conditions. This is because the leakage current between the fingers is greatly affected by changes in environmental conditions such as humidity. Having said this, the break detection circuit 730 fails if the sensor strip is cut to length as this causes a full break in the loop.

FIG. 9C shows a sensor strip having a sensing circuit 710 and an improved break detection circuit 740. The improved break detection circuit 740 is much like the break detection circuit 730 as it has a primary loop running down the length of the sensor strip. Having said this, a number of sub-loops are formed within the primary loop by connecting two sides of the loop at various distances down the length of the sensor strip. This is similar to a set of rungs up a ladder, with transverse connectors connecting two parallel longitudinal tracks.

The multiple sub-loops allow the break detection circuit 740 to continue to function even after the sensor strip has been cut to length. A change in the value of the loop resistance may be used to determine when any break may have occurred. In one embodiment, the system may set the threshold for break detection after the strip has been cut. For instance, the operator may cut the strip and then input an activation command (e.g. via the wireless interface or via the reset switch). The threshold loop resistance may then be set based on the loop resistance at this time (e.g. as a proportion of the loop resistance at start-up). If the loop resistance increases beyond the threshold loop resistance, then a break will be detected.

As discussed with regard to FIG. 4B, spot detection can be improved by providing a transverse component to the fingers relative to the direction of movement of the pest. Having said this, increasing the transverse component increases the number of fingers that are disabled if the strip has to be cut. Various track designs compensate for these effects.

Figure 10B:
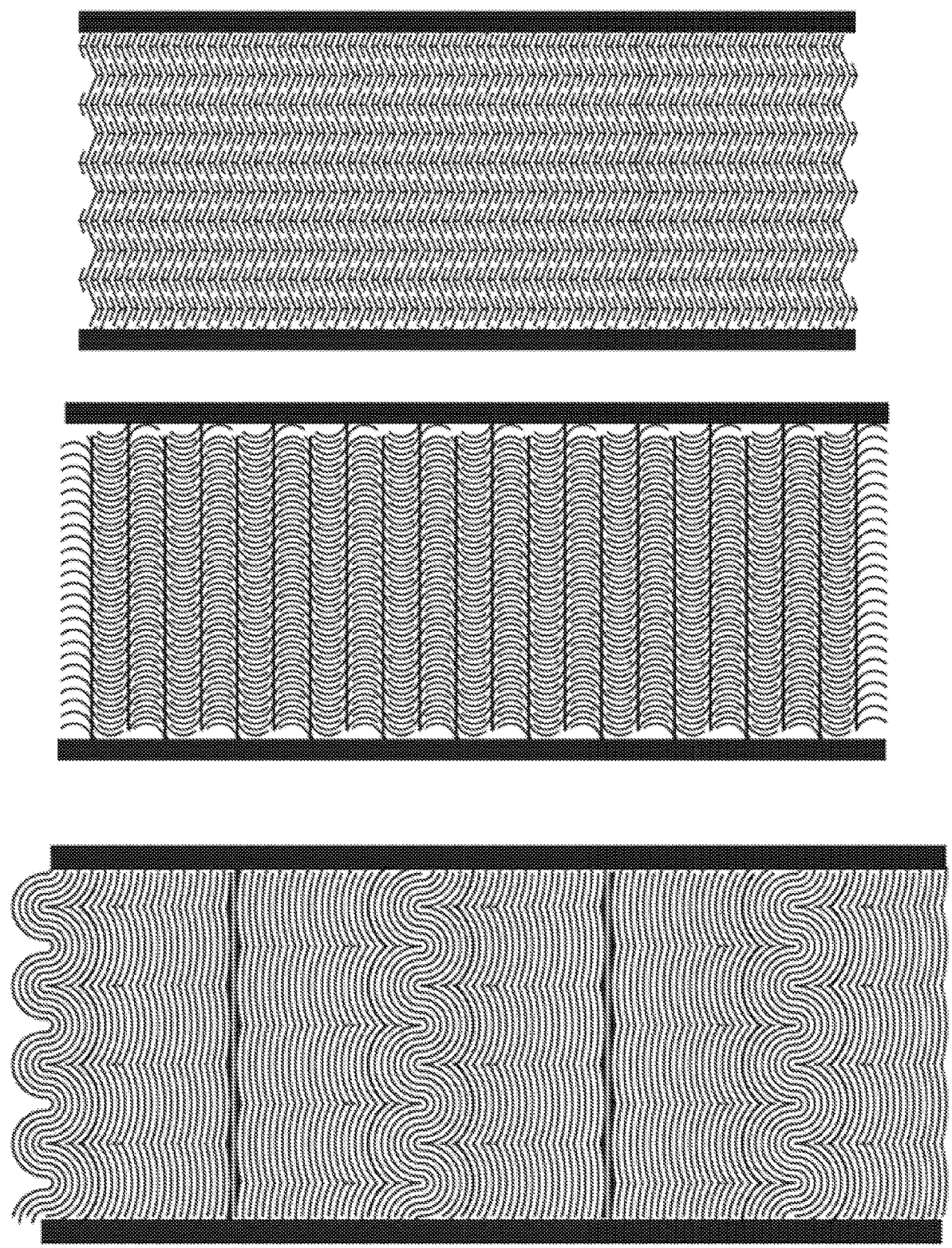
Figure 10C:
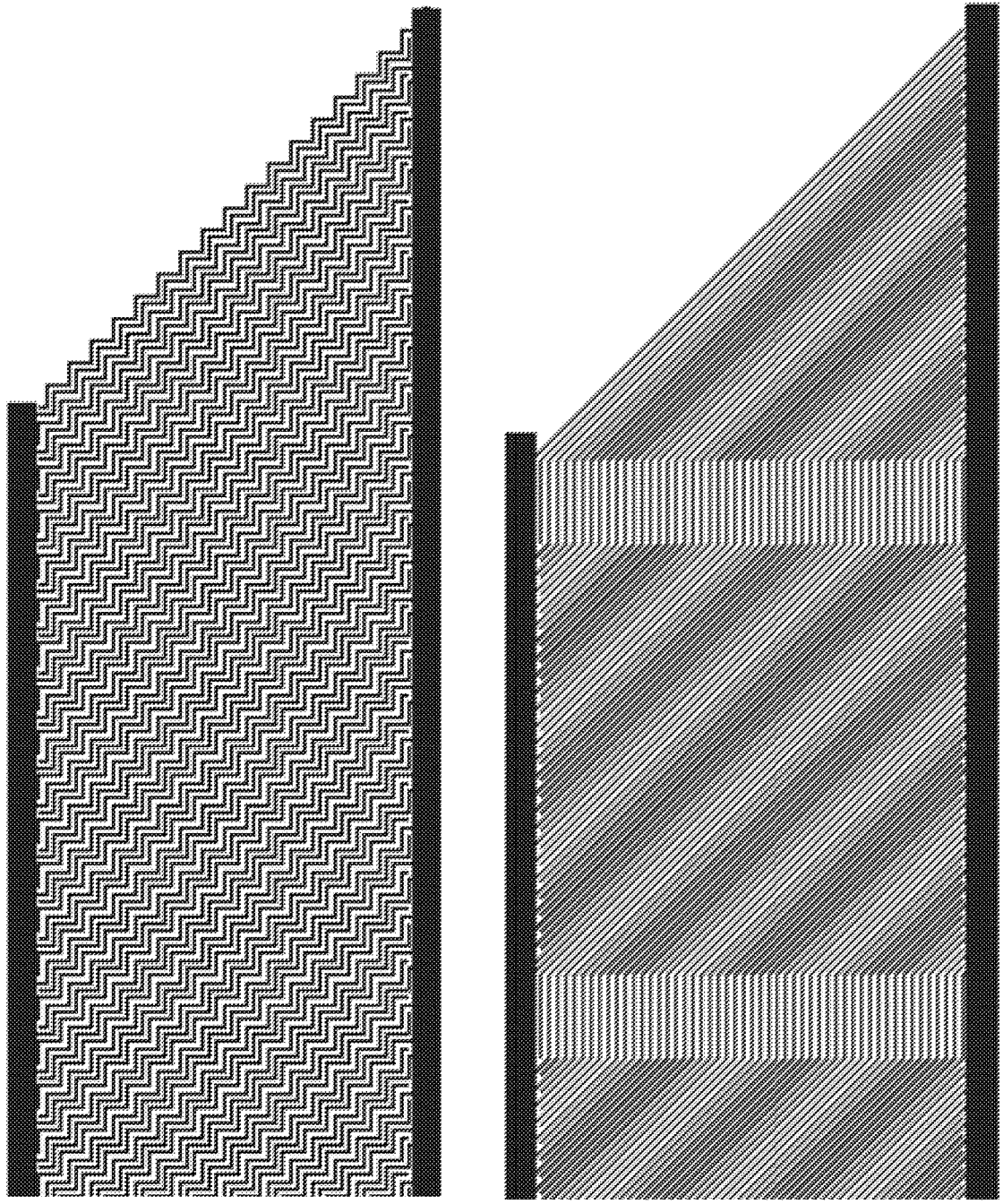

FIGS. 10A-10C show various patterns for interdigitated fingers for a sensor strip according to an embodiment.

Each pattern in FIG. 10A comprises two outer rails and a central rail, each running in parallel to the other and running down the length of the strip. Interdigitated fingers run between each pair of rails, each being connected to one rail and running towards the adjacent rail (in a direction substantially perpendicular to the tracks).

Tunnels in the form of corrugations are placed over the sensing circuits to guide pests across the sensing circuits. To maximise the detection area, the tunnels run across the rails, perpendicular to the rails (perpendicular to the length of the strip).

The first design in FIG. 10A shows an embodiment in which each finger runs perpendicular to the rails. This would have minimal loss of functionality when cut but would be less effective at detecting spots that are stretched out in the direction of travel of the pest.

The second design in FIG. 10A shows the design of FIG. 4B in which a zig-zag pattern is used. Each finger alternates diagonally forward and diagonally backwards along the strip to provide a transverse component to the finger relative to the direction of movement of the pest. This increases the chance of detecting a spot when the pest is moving.

The third design in FIG. 10A provides fingers that each have a central trunk that extends perpendicular to the rails but that has branches that extend from the trunk, parallel to the rails, to increase the chance of spot detection when the pest is moving. The branches of adjacent fingers are interdigitated.

The fourth design of FIG. 10A is similar to the third design; however, on each finger, the middle branch curls around the opposing branch on the adjacent finger. Down the length of the strip the fingers have alternately upward curling and downward curling branches.

The fifth design in FIG. 10A is similar to the third design; however, each branch forms a spiral that spirals around an opposing branch on the adjacent trunk. Opposing branches spiral in opposite directions. Again, this provides a transverse component to the track relative to the direction of pest movement.

The sixth design of FIG. 10A has opposing fingers that spiral around each other towards the centre point between the two fingers. Opposing fingers spiral in the same direction.

The seventh design of FIG. 10A has fingers from one rail that have trunks and branches, similar to those of the third design; however, the branches alternate sides down the length of the trunk. The opposing fingers weave between the branches of the adjacent fingers.

For simplicity, each pattern in FIGS. 10B and 10C shows a single sensing circuit (having two longitudinal rails); however, it will be appreciated that these patterns can be utilised in a dual sensing arrangement as discussed above.

The first design of FIG. 10B has fingers that form a central trunk with a similar zig-zag shape to that of the second design of FIG. 10A; however, at the point of each zig-zag, an arrow extends from the trunk. Opposing arrows from adjacent trunks are interdigitated.

The second design of FIG. 10B is similar to the third design of FIG. 10A; however, the branches form a sinusoidal shape, with the branches on one side being concave and the branches on the other being convex. The branches of adjacent fingers fit within each other.

The third design of FIG. 10B has fingers that form a sinusoidal shape from one rail towards the other. Adjacent fingers fit within each other with decreasing amplitudes until the fingers form scalloped lines instead of a sinusoidal wave. The amplitude of the scalloped lines decreases along the length of the rails until a centre point, at which point the curvature of the lines reverses and the pattern repeats.

The designs of FIG. 10C have fingers that reach between the two rails in a substantially diagonal direction (at 45° to the rails). These provide improved detection; however, large sections would be disabled in the event that the strip is cut.

The first design of FIG. 10C has fingers that form diagonal zig-zags, in a step-like function wherein each finger alternates between being parallel and being perpendicular to the rails along the length of the finger.

The second design of FIG. 10C has diagonal fingers, running 45° to the rails, one set of fingers (from one rail) have tips that run parallel to the rail, the other set of fingers (from the opposing rail) each have a base that runs parallel to the rail such that a region of the sensing circuit has fingers that run parallel to the rails before entering a region of the sensing circuit where the fingers run diagonally to the rails.

The above embodiments discuss the use of differential sensing to more accurately detect pest activity whilst accounting for errors that may be induced by changes in environmental conditions. This is particularly important where the sensing is achieved via sensing circuitry that is printed upon paper or cardboard as, whilst such sensing circuits are relatively easy and inexpensive to manufacture, they are more susceptible to variations in leakage current based on changes in environmental conditions due to the absorption of water into the substrate.

In addition, embodiments described herein provide more effective pest sensing circuitry that are able to more effectively detect pest droppings even when they are deposited as the pests are moving. Various sensing arrangements are presented that improve the chance of a dropping being detected whilst minimise the amount of the circuit that is disabled in the event that the circuit is cut or damaged.

Whilst the above embodiments discuss the use conductive ink printed onto paper or cardboard sensor strips, alternative materials may be used. Equally, whilst corrugated paper or card provides a simple and inexpensive means for providing refuse spaces and channels for directing pests, and in particular bed bugs, to the sensing circuitry, alternative materials such as plastic could be used. Furthermore, whilst the above embodiments discuss detecting bed begs, the sensing circuitry described herein can be scaled to detect any form of pest activity.

Implementations of the subject matter and the operations described in this specification can be realized in digital electronic circuitry, or in computer software, firmware, or hardware, including the structures disclosed in this specification and their structural equivalents, or in combinations of one or more of them. For instance, hardware may include processors, microprocessors, electronic circuitry, electronic components, integrated circuits, etc. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A pest sensor comprising a processor configured to:
receive a first signal indicative of a first impedance across a first sensing circuit;
receive a second signal indicative of a second impedance across a second sensing circuit; and
in response to detecting that one of the first or second signals differs from the other by more than a predefined difference threshold, output an indication of pest activity.

2. The pest sensor of claim 1 wherein the indication of pest activity is output in response to detecting that the one of the first or second signals differs from the other by more than the predefined difference threshold for more than a predetermined period of time or for more than a predetermined number of consecutive measurements.

3. The pest sensor of claim 1 wherein the processor is configured to, in response to detecting that the one of the first or second signals differs from the other by more than the predefined difference threshold, enter a triggered state and remain in the state until receiving an instruction to reset.

4. The pest sensor of claim 1 wherein the indication of pest activity is output via a wireless interface to notify a central monitoring system and/or wherein the indication of pest activity is output via an indicator on the pest sensor.

5. The pest sensor of claim 1 wherein the processor is configured to, in response to detecting that both the first impedance and the second impedance are below the predefined threshold, output an indication that the first and second sensing circuits have been compromised by a short circuit.

6. The pest sensor of claim 1 wherein the processor is configured to output an indication that the first and second sensing circuits have been disconnected or broken in response to both the first impedance and the second impedance being greater than a further predefined threshold that is greater than the predefined threshold.

7. The pest sensor of claim 1 comprising circuitry for obtaining the first and second signals, the circuitry comprising a set of electrodes for connecting to first and second tracks of the first sensing circuit and to first and second tracks of the second sensing circuit, wherein the pest sensor is configured to measure the first signal across the first and second tracks of the first sensing circuit and to measure the second signal across the first and second tracks of the second sensing circuit.

8. The pest sensor of claim 7 wherein the set of electrodes comprise a shared electrode or a shared set of electrodes for connecting to the second tracks of the second tracks of the first and second sensing circuits wherein the second tracks are connected as a shared second track.

9. The pest sensor of claim 7 wherein:
the pest sensor comprises biasing circuitry configured to apply a voltage to the first tracks of the first and second sensing circuits, and to connect the second tracks of the first and second sensing circuits to ground; or
the pest sensor comprises biasing circuitry configured to apply a voltage to the second tracks of the first and second sensing circuitry, and to connect the first tracks of the first and second sensing circuits to ground.

10. The pest sensor of claim 1 further configured to releasably connect to the first and second sensing circuits.

11. The pest sensor of claim 1 wherein the first and second sensing circuits form part of a detector and wherein the pest sensor comprises a breakage sensor configured to connect to a pair of connected electrodes on the detector and to detect when the detector has been disconnected or broken in response to an increase in the loop resistance measured at the pair of connected electrodes.

12. A detector for use in a pest sensing system, the detector comprising first and second sensing circuits, each comprising:
a first electrode connected to a first track running along a longitudinal direction;
a second electrode connected to a second track running substantially parallel to the first track; and
sensing tracks in the form of a set of fingers located between the first and second tracks, a first set of the fingers being connected to the first track only and reaching towards the second track, and a second set of the fingers being connected to the second track only and reaching towards the first track, the first and second sets of fingers being interdigitated with each other and separated from each other such that pest activity can be detected via a reduction in the impedance between the two sets of interdigitated fingers, measured via the first and second electrodes, wherein at least a portion of each finger runs in a direction that has at least some component that is in the longitudinal direction.

13. The detector of claim 12 wherein the interdigitated fingers have complimentary zig-zag patterns running substantially along the transverse direction and providing alternating positive and negative longitudinal components.

14. The detector of claim 12 comprising a set of channels formed over at least one of the first and second sensing circuits and running along the transverse direction to direct pests to pass over the at least one of the first and second sensing circuits.

15. The detector of claim 12 wherein the second track of the first sensing circuit is connected to the second track of the second sensing circuit to form a combined central track running along the longitudinal direction.

16. The detector of claim 12 further comprising a breakage detection circuit comprising one or more conductive loops connected between a pair of electrodes such that breakage or disconnection of the detector can be detected via a change in loop resistance measured across the pair of electrodes.

17. The detector of claim 16 wherein the breakage detection circuit comprises a plurality of conductive loops, each of a different length to the other, extending along the longitudinal direction.

18. The detector of claim 17 wherein the loops are formed by two parallel tracks running along the longitudinal direction and connected by a succession of transverse connectors located at various distances along the longitudinal direction.

19. A pest sensing system comprising a pest sensor and a detector for use in the pest sensing system, wherein:
the detector comprises first and second sensing circuits, each comprising:
a first electrode connected to a first track running along a longitudinal direction;
a second electrode connected to a second track running substantially parallel to the first track; and
sensing tracks in the form of a set of fingers located between the first and second tracks, a first set of the fingers being connected to the first track only and reaching towards the second track, and a second set of the fingers being connected to the second track only and reaching towards the first track, the first and second sets of fingers being interdigitated with each other and separated from each other such that pest activity can be detected via a reduction in the impedance between the two sets of interdigitated fingers, measured via the first and second electrodes; and
the pest sensor comprises a processor configured to:
receive a first signal indicative of a first impedance across the first sensing circuit;
receive a second signal indicative of a second impedance across the second sensing circuit; and
in response to detecting that one of the first or second signals differs from the other by more than a predefined difference threshold, output an indication of pest activity.

20. A detector for use in a pest sensing system, the detector comprising:
first and second sensing circuits, each comprising:
a first electrode connected to a first track running along a longitudinal direction;
a second electrode connected to a second track running substantially parallel to the first track; and
sensing tracks in the form of a set of fingers located between the first and second tracks, a first set of the fingers being connected to the first track only and reaching towards the second track, and a second set of the fingers being connected to the second track only and reaching towards the first track, the first and second sets of fingers being interdigitated with each other and separated from each other such that pest activity can be detected via a reduction in the impedance between the two sets of interdigitated fingers, measured via the first and second electrodes; and
a set of channels formed over at least one of the first and second sensing circuits and running along the transverse direction to direct pests to pass over the at least one of the first and second sensing circuits.

21. A detector for use in a pest sensing system, the detector comprising first and second sensing circuits, each comprising:
a first electrode connected to a first track running along a longitudinal direction;
a second electrode connected to a second track running substantially parallel to the first track; and
sensing tracks in the form of a set of fingers located between the first and second tracks, a first set of the fingers being connected to the first track only and reaching towards the second track, and a second set of the fingers being connected to the second track only and reaching towards the first track, the first and second sets of fingers being interdigitated with each other and separated from each other such that pest activity can be detected via a reduction in the impedance between,
wherein the second track of the first sensing circuit is connected to the second track of the second sensing circuit to form a combined central track running along the longitudinal direction.

22. A detector for use in a pest sensing system, the detector comprising:
first and second sensing circuits, each comprising:
a first electrode connected to a first track running along a longitudinal direction;

a second electrode connected to a second track running substantially parallel to the first track; and sensing tracks in the form of a set of fingers located between the first and second tracks, a first set of the fingers being connected to the first track only and reaching towards the second track, and a second set of the fingers being connected to the second track only and reaching towards the first track, the first and second sets of fingers being interdigitated with each other and separated from each other such that pest activity can be detected via a reduction in the impedance between; and a breakage detection circuit comprising one or more conductive loops connected between a pair of electrodes such that breakage or disconnection of the detector can be detected via a change in loop resistance measured across the pair of electrodes.

\* \* \* \* \*